United States Patent [19]
Yamamoto et al.

[11] Patent Number: 6,064,079
[45] Date of Patent: May 16, 2000

[54] GALLIUM NITRIDE-BASED COMPOUND SEMICONDUCTOR DEVICE

[75] Inventors: Masahiro Yamamoto, Kawasaki; Shinya Nunoue, Ichikawa; Katsunobu Sasanuma, Tokyo; Masayuki Ishikawa, Yokohama, all of Japan

[73] Assignee: Kabushiki Kaisha Toshiba, Kawasaki, Japan

[21] Appl. No.: 09/115,239

[22] Filed: Jul. 14, 1998

[30] Foreign Application Priority Data

Jul. 14, 1997 [JP] Japan .................................. 9-188523

[51] Int. Cl.$^7$ .............................. H01L 33/00; H01S 3/19
[52] U.S. Cl. ........................... 257/101; 257/96; 257/102; 257/103; 372/46
[58] Field of Search .................... 257/94, 96, 101, 257/102, 103, 13, 615, 743, 744, 745; 372/45, 46

[56] References Cited

U.S. PATENT DOCUMENTS 5,821,555  10/1998  Saito et al. .................................. 257/97
5,889,295   3/1999  Rennie et al. ........................... 257/102

*Primary Examiner*—Minh Loan Tran
*Attorney, Agent, or Firm*—Oblon, Spivak, McClelland, Maier & Neustadt, P.C.

[57] ABSTRACT

Disclosed is a gallium nitride-based compound semiconductor device, including a laminate film consisting of a plurality of layers stacked one upon the other to form a pn-junction and formed of InGaAlN. The semiconductor device also includes an n-side electrode and a p-side electrode to supply current to the pn-junction. Further included is a heat generation structure formed within the laminate film. The heat generation structure includes a low resistivity portion having a relatively low resistivity and a high resistivity portion having a relatively high resistivity and positioned adjacent to the low resistivity portion. The low resistivity portion and the high resistivity portion are formed within a single layer, differ from each other in carrier concentration, and formed by introducing an impurity into the single layer in a different dose such that the low resistivity portion is positioned closer to the p-side electrode than the high resistivity portion.

22 Claims, 6 Drawing Sheets

GALLIUM NITRIDE-BASED COMPOUND SEMICONDUCTOR DEVICE

BACKGROUND OF THE INVENTION

The present invention relates to a gallium nitride-based compound semiconductor device, particularly, to a gallium nitride-based compound semiconductor laser.

In recent years, gallium nitride-based compound semiconductor materials such as GaN, InGaN, GaAlN, and InGaAlN attract attentions as materials of a blue semiconductor laser. The semiconductor lasers formed of these compound semiconductor materials emit light having a short wavelength, making it possible to draw the emitted laser beam to have a small diameter. Therefore, these lasers are expected to provide an excellent light source for a high density information processing apparatus such as an optical disk.

In general, magnesium is used as a p-type impurity, i.e., dopant, in a gallium nitride-based compound semiconductor. This impurity has a deep acceptor level and, thus, is low in activation rate, with the result that only one above several tens to one above several hundreds of the doped impurity acts as an effective p-type carrier. If the dose of the impurity is excessively increased in an attempt to increase the carrier density, the quality of the p-type semiconductor crystal is impaired. It is also reported that an excessively large dose amount inversely leads to reduction in the carrier density.

Under the circumstances, it is essentially impossible to obtain a p-type layer of a low resistivity in a gallium nitride-based semiconductor device using magnesium as a p-type impurity. It should also be noted that the number of p-type carriers, i.e., holes, in the p-type layer is markedly smaller than that of n-type carriers, i.e., electrons, in the n-type layer, giving rise to a carrier overflow phenomenon that the n-type carriers overflow the active layer to reach the p-type layer. Such being the situation, it is difficult to use a gallium nitride-based compound semiconductor material for manufacturing a semiconductor device having a low threshold value, operable at a low voltage, exhibiting a high reliability and, thus, adapted for use in, for example, an optical disk. Also, a semiconductor device adapted for an optical arithmetic calculation such as a short wave bistable type or self-excitation type semiconductor device has not yet been developed.

BRIEF SUMMARY OF THE INVENTION

An object of the present invention, which has been achieved in view of the above-noted problems inherent in the prior art, is to provide a gallium nitride-based compound semiconductor device low in threshold value, operable at a low voltage, exhibiting a high reliability and, thus, adapted for use in a high density information processing apparatus such as an optical disk.

Another object is to provide a short wave bistable type or self-excitation type gallium nitride-based compound semiconductor device.

According to an aspect of the present invention, there is provided a gallium nitride-based compound semiconductor device, comprising:

a laminate film consisting of a plurality of layers stacked one upon the other to form a pn-junction and formed of InGaAlN:

an n-side electrode and a p-side electrode to supply current to the pn-junction; and a heat generation structure formed within the laminate film and comprising a low resistivity portion having a relatively low resistivity and a high resistivity portion having a relatively high resistivity and positioned adjacent to the low resistivity portion;

wherein the low resistivity portion and the high resistivity portion are formed within a single layer, differ from each other in carrier concentration, and formed by introducing an impurity into the single layer in a different dose such that the low resistivity portion is positioned closer to the p-side electrode than the high resistivity portion.

According to another aspect of the present invention, there is provided a gallium nitride-based compound semiconductor device, comprising:

a laminate film consisting of a plurality of layers stacked one upon the other to form a pn-junction and formed of InGaAlN:

an n-side electrode and a p-side electrode to supply current to the pn-junction; and a heat generation structure formed within the laminate film and comprising a low resistivity portion having a relatively low resistivity and a high resistivity portion having a relatively high resistivity and positioned adjacent to the low resistivity portion;

wherein the low resistivity portion and the high resistivity portion differ from each other in electrical conductivity, and consist of two layers stacked one upon the other such that the layer constituting the low resistivity portion is positioned closer to the p-side electrode than the other layer constituting the high resistivity portion.

Further, according to still another aspect of the present invention, there is provided a gallium nitride-based compound semiconductor device, comprising:

a laminate film consisting of a plurality of layers stacked one upon the other to form a pn-junction and formed of InGaAlN:

an n-side electrode and a p-side electrode to supply current to the pn-junction; and a heat generation structure formed within the laminate film and comprising a low resistivity portion having a relatively low resistivity and a high resistivity portion having a relatively high resistivity and positioned adjacent to the low resistivity portion;

wherein the low resistivity portion is positioned closer to the p-side electrode than the high resistivity portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figures 1A, 1B:
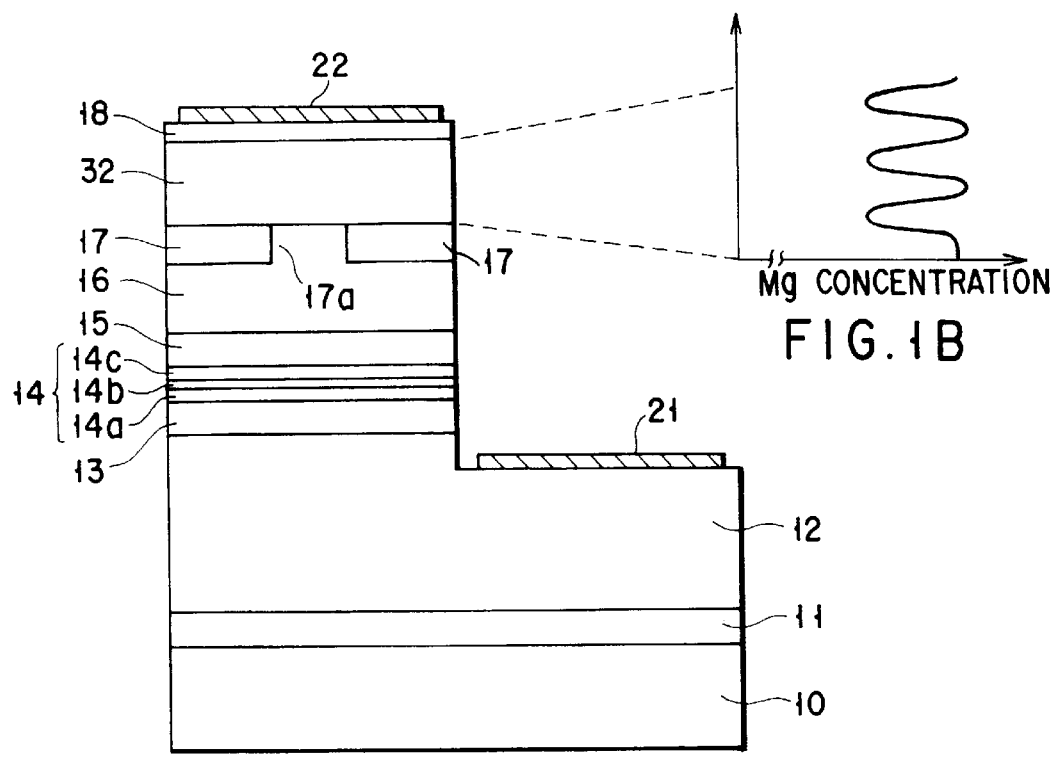
FIG. 1A shows a gallium nitride-based compound semiconductor laser according to one embodiment of the present invention.
FIG. 1B is a graph showing the distribution of a p-type impurity Mg in a p-type modulation layer 32 included in the gallium nitride-based semiconductor laser shown in FIG. 1A.

Let us describe some embodiments of the present invention with reference to the accompanying drawings. In the following description, those members of the semiconductor lasers which are substantially equal to each other in construction and function are denoted by the same reference numerals, as desired, so as to avoid an overlapping description.

Figures 2A, 2B:
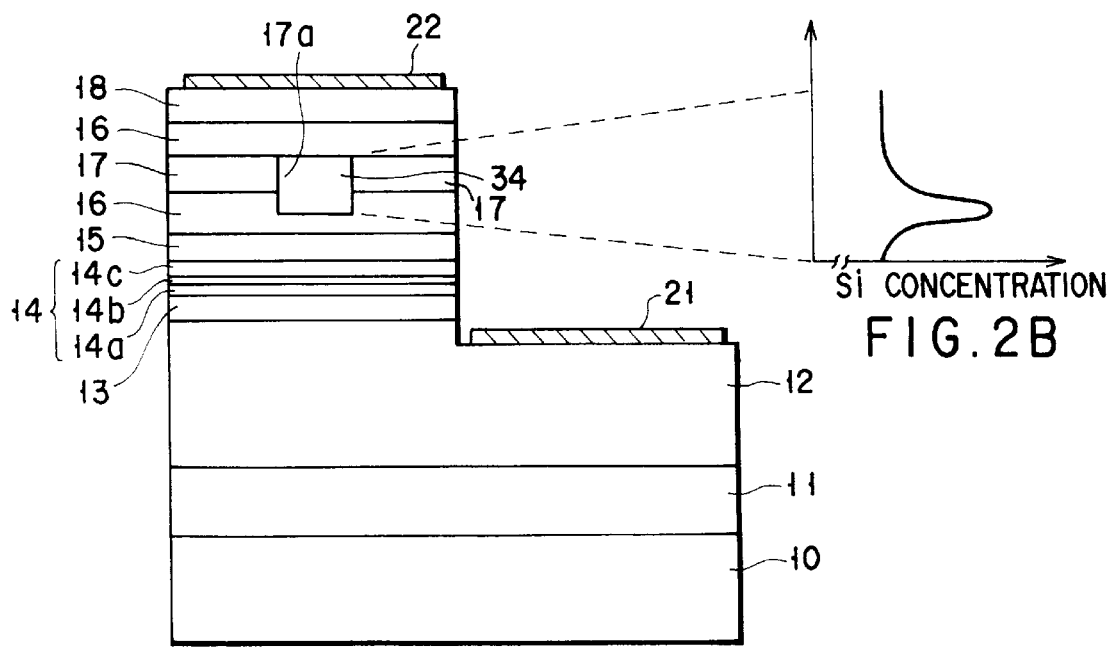
FIG. 2A shows a gallium nitride-based compound semiconductor laser according to another embodiment of the present invention.
FIG. 2B is a graph showing the distribution of an n-type impurity Si in a p-type modulation layer 34 included in the gallium nitride-based semiconductor laser shown in FIG. 2A.

FIGS. 1A and 2A show gallium nitride-based compound semiconductor lasers according to different embodiments of the present invention. Each of these embodiments is featured in that a heat generation structure for substantially increasing p-type carriers is formed by applying a modulation doping to a p-type layer consisting essentially of a gallium nitride-based compound semiconductor represented by a general formula $In_xGa_yAl_{1-x-y}N$ ($0 \leq x \leq 1$, $0 \leq y \leq 1$). The term "modulation doping" noted above denotes the doping for forming a plurality of regions differing from each other in the carrier concentration within a single layer by introducing a single or a plurality of impurities with different doses into the single layer.

To be more specific, in a gallium nitride-based compound semiconductor laser, a modulation doping is applied to a layer interposed between a p-side electrode and a pn-junction to form a p-type modulation layer. The modulation layer is constructed to include a low resistivity portion containing a high concentration of impurities and a high resistivity portion containing a low concentration of impurities. The carriers injected through the p-side electrode pass through the low resistivity portion and, then, through the high resistivity portion. When the carriers pass from the low resistivity region into the high resistivity region, heat is generated within the high resistivity region. In the present invention, this heat generation is utilized for solving the problem inherent in the conventional gallium nitride-based compound semiconductor layer, i.e., the problem that the p-type carrier concentration is low, leading to a high oscillation threshold value.

In general, the heat generation causes breakage of the element. However, the present inventors have found that the heat generation from the p-type modulation layer of the construction described above produces a prominent effect. Specifically, the heat generation serves to activate the impurity Mg having a deep acceptor level, said impurity Mg being contained in the p-type modulation layer or an adjacent p-type layer, so as to increase the substantial p-type carriers. Particularly, the generated heat can be utilized exclusively for forming the substantial p-type carriers by making optimum the resistance and thickness of the low resistivity portion and the high resistivity portion. As a result, it is possible to suppress, for example, the oscillation threshold value of a semiconductor laser.

The semiconductor laser shown in FIG. 1A comprises a single crystal substrate 10, e.g., a sapphire substrate, an undoped GaN buffer layer 11 formed on the substrate 10, and an n-type contact layer 12 consisting of a Si-doped GaN and formed on the buffer layer 11. Formed on the n-type contact layer 12 is a laminate structure consisting of an n-type cladding layer 13 consisting of a Si-doped GaAlN, an active layer 14, and a p-type cladding layer 15 consisting of a Mg-doped GaAlN, thereby forming a double hetero junction structure. The active layer 14 is also of a laminate structure consisting of an undoped optical guide layer 14a consisting of an undoped GaN, a quantum well layer 14b consisting of InGaN/InGaN, and an optical guide layer 14c consisting of a p-type GaN.

Formed on the p-type cladding layer 15 is a laminate structure consisting of a p-type low resistivity layer 16 consisting of a Mg-doped low resistivity GaN, a high resistivity or n-type current blocking layer 17 consisting of a material represented by a general formula $In_xGa_yAl_{1-x-y}N$ ($0 \leq x \leq 1$, $0 \leq y \leq 1$), a p-type modulation layer 32 consisting of a Mg-doped GaN, and a p-type contact layer 18 consisting of a Mg-doped low resistivity GaN. Also, the laminate structure formed on the n-type contact layer 12 including the uppermost p-type contact layer 18 and a surface region of the n-type contact layer 12 is selectively removed by etching. An n-side electrode 21 is formed on the exposed surface of the n-type contact layer 12, and a p-side electrode 22 is formed on a surface of the remaining p-type contact layer 18.

The current blocking layer 17 has a striped open portion 17a having a width of 3 μm so as to form a current path narrowing structure. This width is a distance of a region sandwiched by two portions of the current blocking layer 17. The threshold value of the laser of the construction described above is 1 kA/cm$^2$, which is not more than one-fifth of the conventional level.

A modulation doping of an impurity Mg is applied to the p-type modulation layer 32 so as to permit the impurity Mg concentration to be distributed as shown in FIG. 1B. (In this case, the distribution of the Mg concentration is equal to the distribution of the p-type carrier concentration). In this embodiment, the p-type modulation layer 32 is formed to include a plurality of low resistivity regions each having a high Mg concentration and a plurality of high resistivity regions each having a low Mg concentration. As shown in the drawing, these low resistivity regions and high resistivity regions are alternately stacked one upon the other in a vertical direction. It is important to note the uppermost and lowermost regions of the stacked structure consist of the low resistivity regions each having a high Mg concentration. As described previously, the high resistivity regions each having a low concentration of Mg, which is a p-type carrier, act as heat generation regions.

The semiconductor laser shown in FIG. 2A is equal in construction to the semiconductor laser shown in FIG. 1A in a lower portion including the sapphire substrate 10 up to the p-type cladding layer 15. In the embodiment of FIG. 2A, formed on the p-type cladding layer 15 is a laminate structure including a p-type low resistivity layer 16 consisting of a Mg-doped low resistivity GaN and a p-type contact layer 18 consisting of a Mg-doped low resistivity GaN. Also, the n-side electrode 21 is formed on a surface of the n-type contact layer 12 exposed by the etching, and the p-side electrode 22 is formed on a surface of the p-type contact layer 18.

The high resistivity or n-type current blocking layer 17 is formed as an intermediate layer within the p-type low resistivity layer 16. The current blocking layer 17 includes a striped open portion 17a having a width of 3 μm so as to form a current path narrowing structure. Further, a p-type modulation layer 34 is formed inside the p-type low resistivity layer 16 in a manner to fill the open portion 17a of the current blocking layer 17. The semiconductor laser of the particular construction exhibits a threshold value of 1 kA/cm$^2$, which is not more than one-fifth of the conventional level.

The p-type modulation layer 34 contains an n-type impurity of Si introduced in the modulation doping step in addition to a predetermined concentration of the p-type impurity Mg doped in the step of forming the p-type low resistivity layer 16. FIG. 2B shows the distribution of the Si concentration within the p-type modulation layer 34. As shown in FIG. 2B, a single region having a high Si concentration is formed in a central portion of the p-type modulation layer 34 in this embodiment. It should be noted that the concentration of the n-type impurity Si is set at a low level appropriately such that the conductivity type of the modulation layer 34 remains to be p-type even in the highest Si concentration region. Since the n-type impurity Si serves to compensate the carrier of the p-type impurity Mg, the central region of the p-type modulation layer 34 having a high Si concentration acts as a high resistivity region having a low p-type carrier concentration, with the upper and lower regions each having a low Si concentration acting as low resistivity regions each having a high p-type carrier concentration. As described previously, the high resistivity region having a low p-type carrier concentration, i.e., the central region of the modulation layer 34, acts as a heat generation region.

Various methods such as an organic metal vapor growing method and a molecular beam growing method can be employed for forming the gallium nitride-based compound semiconductor layers in the embodiments shown in FIGS. 1A and 2A. For performing the modulation doping, the gallium nitride-based compound semiconductor layer can be modulated in the growing step of the semiconductor layer. In addition, various other methods such as an impurity diffusion method and an ion implantation method can also be employed. Further, the modulation doping can be performed to have the carrier concentration distributed in a lateral direction, not in a vertical direction as shown in FIGS. 1B and 2B.

In the embodiments shown in FIGS. 1A and 2A, a heat generation structure is formed by applying a modulation doping in a gallium nitride-based compound semiconductor device, making it possible to provide a semiconductor device having a low threshold value which was inconceivable in the past.

FIGS. 3 to 9 are cross sectional views each showing a gallium nitride-based compound semiconductor laser according to another embodiment of the present invention. The semiconductor laser in each of these embodiments comprises a p-type high resistivity layer having a relatively high resistivity and at least two p-type low resistivity layers each having a relatively low resistivity. Each of these high resistivity layer and the low resistivity layers consists essentially of a gallium nitride-based compound semiconductor represented by a general formula $In_xGa_yAl_{1-x-y}N$ ($0 \leq x \leq 1$, $0 \leq y \leq 1$). It should be noted that the p-type high resistivity layer is sandwiched between two adjacent p-type low resistivity layers so as to form a heat generation structure serving to increase the substantial p-type carriers.

In the present invention, two or more compound semiconductor layers differing from each other in resistivity, i.e., the high resistivity layer and the low resistivity layer, can be formed by varying the Ga amount contained in the compound semiconductor layer. Naturally, the high resistivity layer and the low resistivity layer are made different from each other in the Al and In contents, too.

To be more specific, the heat generation structure is arranged in the form of a heat generating laminate structure between the p-side electrode and a pn-junction in a gallium nitride-based compound semiconductor laser. In this case, the heat generating laminate structure is constructed such that the carriers injected through the p-side electrode pass first through the p-type low resistivity layer and, then, through the p-type high resistivity layer. As described previously, heat is generated within the high resistivity layer when the carriers passing through the low resistivity layer pass through the high resistivity layer. The particular heat generation is utilized in the present invention for overcoming the problem inherent in the conventional gallium nitride-based compound semiconductor laser, i.e., the problem that the p-type carrier concentration is low to make the oscillation threshold value high.

In general, the heat generation causes breakage of the element. However, the present inventors have found that the heat generation from the heat generating laminate structure of the construction described above produces a prominent effect. Specifically, the heat generation serves to activate the impurity Mg having a deep acceptor level, said impurity Mg being contained in the p-type high resistivity layer or an adjacent p-type low resistivity layer, so as to increase the substantial p-type carriers. Particularly, the generated heat can be utilized exclusively for forming the substantial p-type carriers by making optimum the resistance and thickness of the low resistivity layer and the high resistivity layer. As a result, it is possible to suppress, for example, the oscillation threshold value of a semiconductor laser.

Further, the heat generation region can be controlled by means of, for example, an impurity diffusion, if the composition of the high resistivity layer is locally changed to bring about a local difference in the heat conductivity. It should also be noted that, if the current injection is decreased after oscillation caused by the carriers obtained by the heat generation, the heat generation is decreased and, thus, the resistivity is increased so as to bring about heat generation again. The heat generation also brings about carrier generation again. It follows that the carriers are maintained at an oscillation level so as to exhibit a bistable state.

Figure 3:
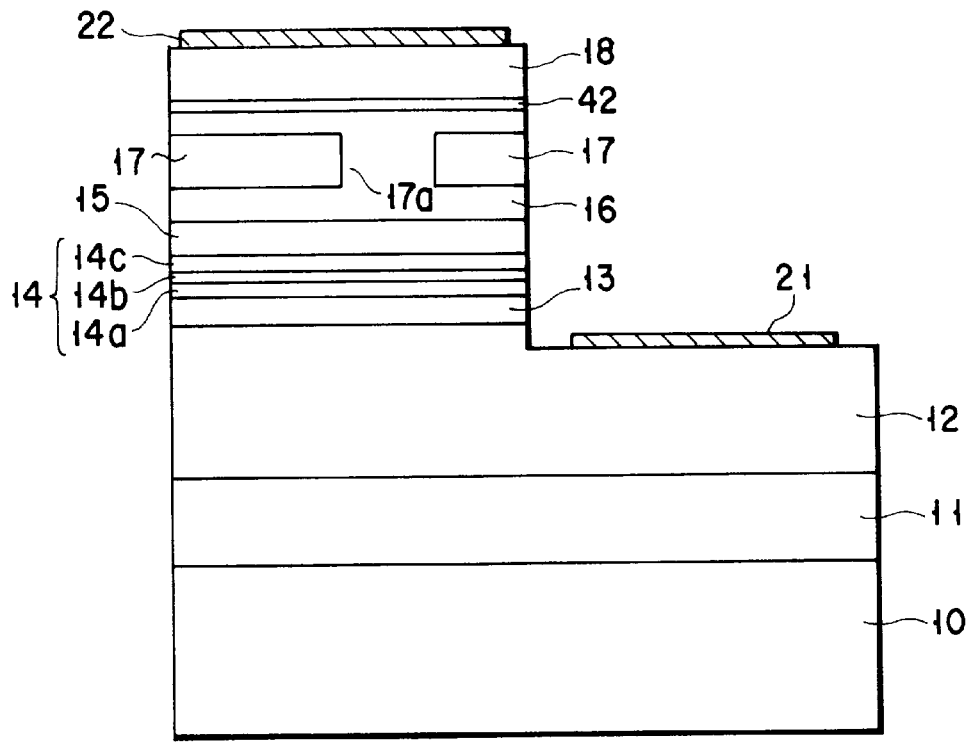
FIG. 3 shows a gallium nitride-based compound semiconductor laser according to another embodiment of the present invention.

In the semiconductor laser shown in FIG. 3, a laminate structure consisting of a buffer layer 11 formed of an undoped GaN and an n-type contact layer 12 formed of a Si-doped GaN is formed on a single crystalline substrate, e.g., sapphire substrate 10. Also, a laminate structure consisting of an n-type cladding layer 13 formed of a Si-doped GaAlN, an active layer 14 and a p-type cladding layer 15 formed of a Mg-doped GaAlN is formed on the n-type contact layer 12 so as to form a double hetero junction structure. The active layer 14 is also of a laminate structure consisting of an optical guide layer 14a formed of an undoped GaN, a quantum well layer 14b formed of InGaN/InGaN, and another optical guide layer 14c formed of a p-type GaN.

Formed on the p-type cladding layer 15 is a laminate structure consisting of a p-type low resistivity layer 16 formed of a Mg-doped GaN, a p-type high resistivity layer 42 formed of a Mg-doped GaN, and a p-type contact layer 18 formed of a Mg-doped GaN and exhibiting a low resistivity. A high resistivity type or an n-type current blocking layer 17 is formed as an intermediate layer within the p-type low resistivity layer 16. In this embodiment, the laminate structure formed on the n-type contact layer 12 including the uppermost p-type contact layer 18 and a surface region of the n-type contact layer 12 is selectively removed by etching. An n-side electrode 21 is formed on the exposed surface of the n-type contact layer 12, and a p-side electrode 22 is formed on a surface of the remaining p-type contact layer 18.

The current blocking layer 17 has a striped opening 17a having a width of 3 μm so as to form a current path narrowing structure. Also, the p-type high resistivity layer 42 is sandwiched between the p-type low resistivity 16 and the p-type contact layer 18 so as to form a heat generation laminate structure. The threshold value of the laser constructed as shown in FIG. 3 is 1 kA/cm$^2$, which is one-fifth or less of the value in the prior art.

Figure 4:
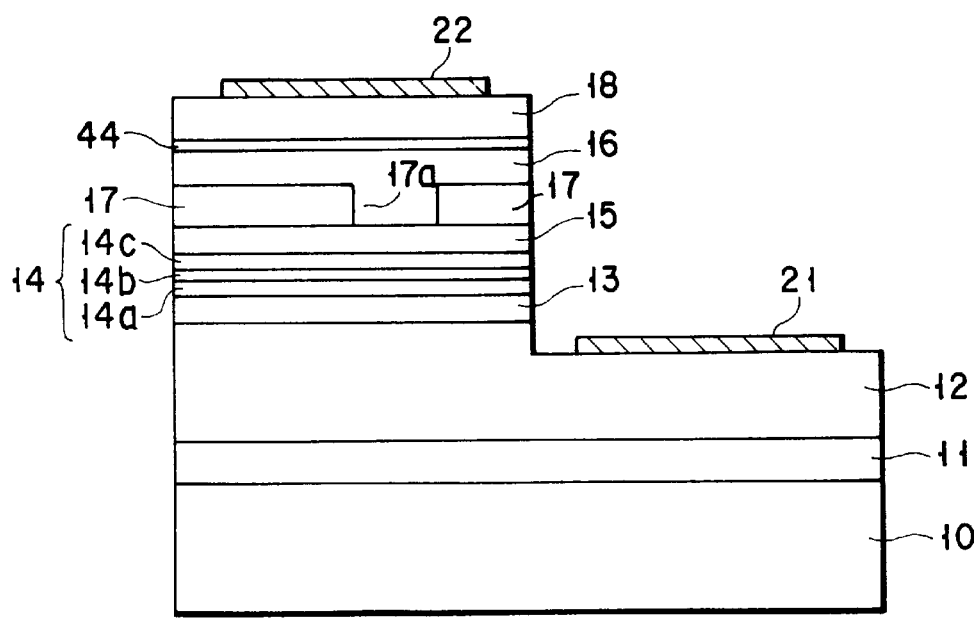
FIG. 4 shows a gallium nitride-based compound semiconductor laser according to another embodiment of the present invention.

The semiconductor laser of the embodiment shown in FIG. 4 is equal in construction to the semiconductor laser shown in FIG. 3 in the laminate structure including the lowermost layer of the sapphire substrate 10 and the uppermost layer of the p-type cladding layer 15. In the embodiment of FIG. 4, formed on the p-type cladding layer 15 is a laminate structure consisting of a high resistivity type or an n-type current blocking layer 17, a p-type low resistivity layer 16 formed of a Mg-doped GaN, a p-type high resistivity layer 44 formed of a Mg-doped InGaN, and a p-type contact layer 18 formed of a Mg-doped GaN and exhibiting a low resistivity. The laminate structure formed on the n-type contact layer 12 including the uppermost p-type contact layer 18 and a surface region of the n-type contact layer 12 is selectively removed by etching. An n-side electrode 21 is formed on the exposed surface of the n-type contact layer 12, and a p-side electrode 22 is formed on a surface of the remaining p-type contact layer 18.

The current blocking layer 17 has a striped opening 17a having a width of 3 μm so as to form a current path narrowing structure. Also, the p-type high resistivity layer 44 is sandwiched between the p-type low resistivity 16 and the p-type contact layer 18 so as to form a heat generation laminate structure. The threshold value of the laser constructed as shown in FIG. 4 is 1 kA/cm$^2$, which is one-fifth or less of the value in the prior art.

Figure 5:
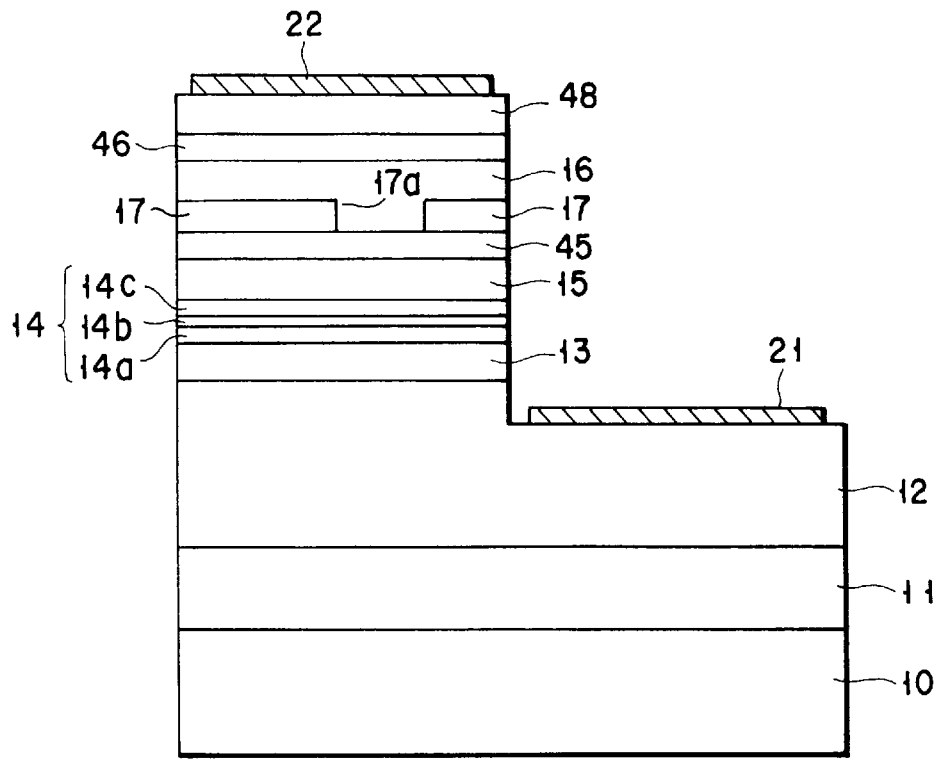
FIG. 5 shows a gallium nitride-based compound semiconductor laser according to another embodiment of the present invention.

The semiconductor laser of the embodiment shown in FIG. 5 is equal in construction to the semiconductor laser shown in FIG. 3 in the laminate structure including the lowermost layer of the sapphire substrate 10 and the uppermost layer of the p-type cladding layer 15. In the embodiment of FIG. 5, formed on the p-type cladding layer 15 is a laminate structure consisting of a p-type layer 45 formed of a Mg-doped GaN, a high resistivity type or an n-type current blocking layer 17, a p-type low resistivity layer 16 formed of a Mg-doped GaN, a p-type high resistivity layer 46 formed of a Mg-doped GaAlN, and a p-type contact layer 48 formed of a Mg-doped InGaN and exhibiting a low resistivity. The laminate structure formed on the n-type contact layer 12 including the uppermost p-type contact layer 48 and a surface region of the n-type contact layer 12 is selectively removed by etching. An n-side electrode 21 is formed on the exposed surface of the n-type contact layer 12, and a p-side electrode 22 is formed on a surface of the remaining p-type contact layer 48.

The current blocking layer 17 has a striped opening 17a having a width of 3 μm so as to form a current path narrowing structure. Also, the p-type high resistivity layer 46 is sandwiched between the p-type low resistivity 16 and the p-type contact layer 48 so as to form a heat generation laminate structure. The threshold value of the laser constructed as shown in FIG. 5 is 1 kA/cm$^2$, which is one-fifth or less of the value in the prior art.

Figure 6:
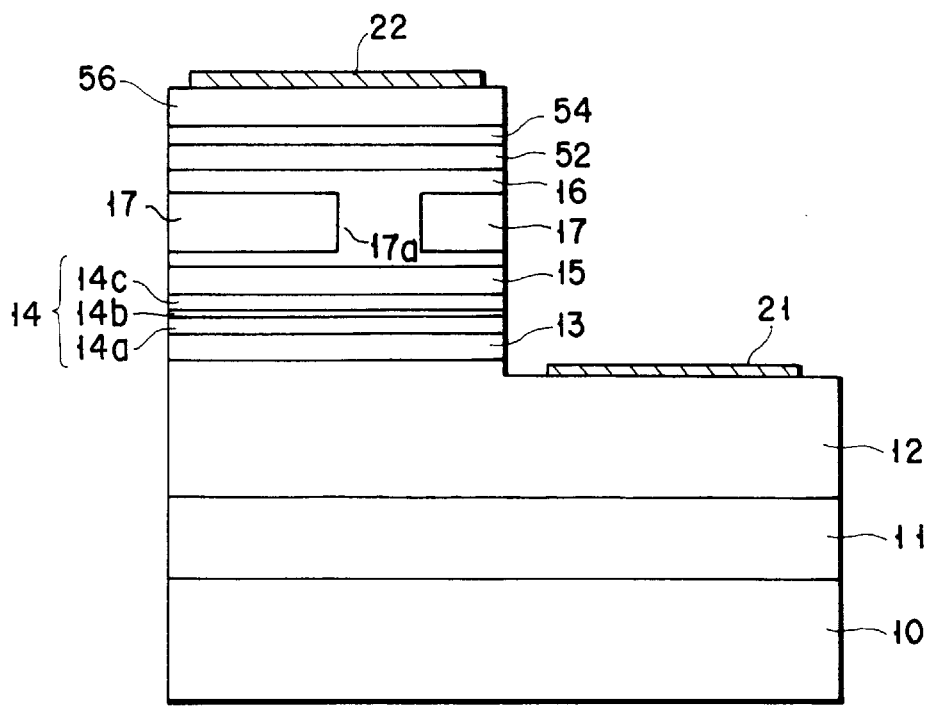
FIG. 6 shows a gallium nitride-based compound semiconductor laser according to another embodiment of the present invention.

The semiconductor laser of the embodiment shown in FIG. 6 is equal in construction to the semiconductor laser shown in FIG. 3 in the laminate structure including the lowermost layer of the sapphire substrate 10 and the uppermost layer of the p-type cladding layer 15. In the embodiment of FIG. 6, formed on the p-type cladding layer 15 is a laminate structure consisting of a p-type low resistivity layer 16 formed of a Mg-doped GaN, a high resistivity type or an n-type current blocking layer 17 included in the p-type cladding layer 16 as an intermediate layer, a p-type high resistivity layer 52 formed of a Mg-doped In$_{0.3}$GaN, a p-type low resistivity layer 54 formed of a Mg-doped GaN, and a p-type contact layer 56 formed of a Mg-doped In$_{0.2}$GaN and exhibiting a low resistivity. The laminate structure formed on the n-type contact layer 12 including the uppermost p-type contact layer 56 and a surface region of the n-type contact layer 12 is selectively removed by etching. An n-side electrode 21 is formed on the exposed surface of the n-type contact layer 12, and a p-side electrode 22 is formed on a surface of the remaining p-type contact layer 56.

The current blocking layer 17 has a striped opening 17a having a width of 3 μm so as to form a current path narrowing structure. Also, the p-type high resistivity layer 52 is sandwiched between the p-type low resistivity 16 and the p-type low resistivity layer 54 so as to form a heat generation laminate structure. The threshold value of the laser constructed as shown in FIG. 6 is 1 kA/cm$^2$, which is one-fifth or less of the value in the prior art.

Figure 7:
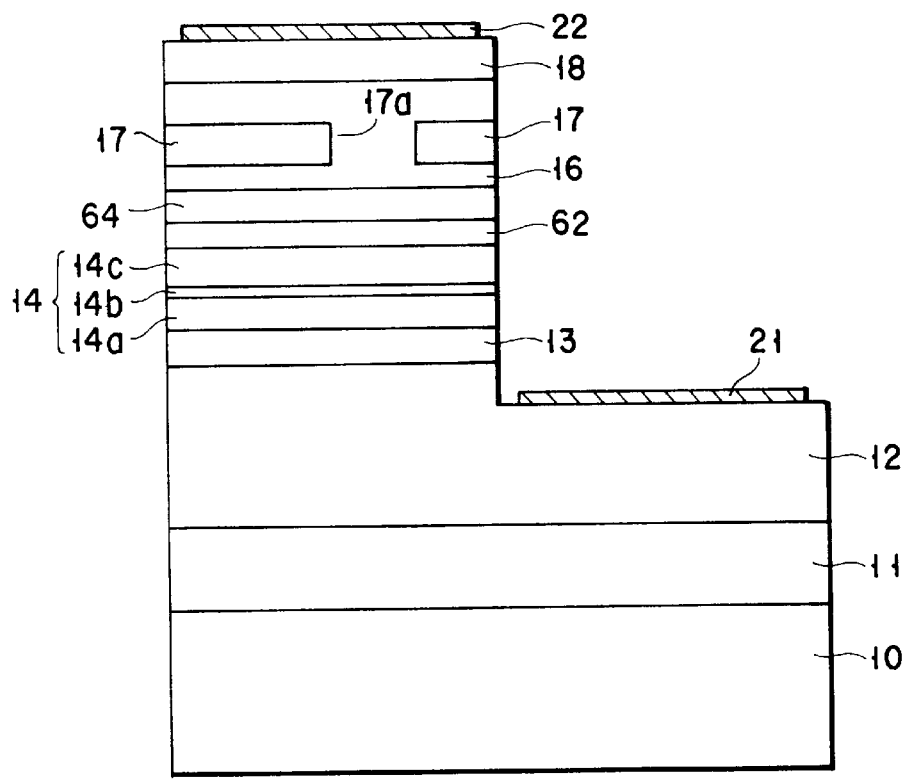
FIG. 7 shows a gallium nitride-based compound semiconductor laser according to another embodiment of the present invention.

The semiconductor laser of the embodiment shown in FIG. 7 is equal in construction to the semiconductor laser shown in FIG. 3 in the laminate structure including the lowermost layer of the sapphire substrate 10 and the uppermost layer of the active layer 14. In the embodiment of FIG.

7, formed on the active layer 14 is a laminate structure consisting of a p-type cladding layer 62 formed of a Mg-doped $Ga_{0.7}Al_{0.3}N$ and exhibiting a low resistivity, a high resistivity type layer 64 formed of a Mg-doped $Ga_{0.6}Al_{0.4}N$, a p-type low resistivity layer 16 formed of a Mg-doped GaN and including as an intermediate layer a high resistivity type or an n-type current blocking layer 17, and a p-type contact layer 18 formed of a Mg-doped GaN and exhibiting a low resistivity. The laminate structure formed on the n-type contact layer 12 including the uppermost p-type contact layer 18 and a surface region of the n-type contact layer 12 is selectively removed by etching. An n-side electrode 21 is formed on the exposed surface of the n-type contact layer 12, and a p-side electrode 22 is formed on a surface of the remaining p-type contact layer 18.

The p-type high resistivity layer 64 is sandwiched between the p-type cladding layer 62 and the p-type low resistivity 16 so as to form a heat generation laminate structure. Also, the current blocking layer 17 has a striped opening 17a having a width of 3 µm so as to form a current path narrowing structure. The threshold value of the laser constructed as shown in FIG. 7 is 1 $kA/cm^2$, which is one-fifth or less of the value in the prior art.

Figure 8:
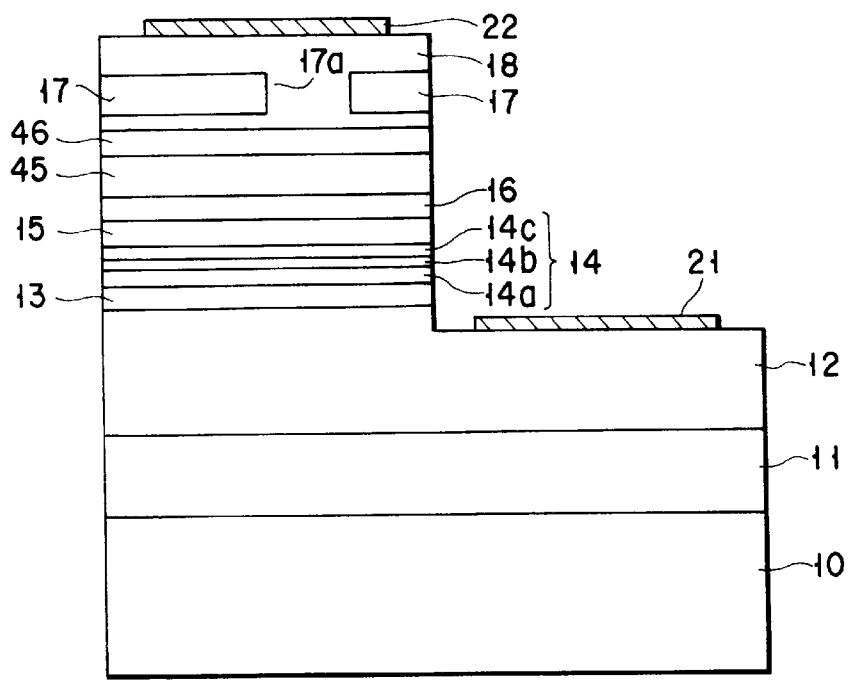
FIG. 8 shows a gallium nitride-based compound semiconductor laser according to another embodiment of the present invention.

The semiconductor laser of the embodiment shown in FIG. 8 is equal in construction to the semiconductor laser shown in FIG. 3 in the laminate structure including the lowermost layer of the sapphire substrate 10 and the uppermost layer of the p-type cladding layer 15. In the embodiment of FIG. 8, formed on the p-type cladding layer 15 is a laminate structure consisting of a p-type low resistivity layer 16 formed of a Mg-doped GaN, a p-type layer 45 formed of a Mg-doped GaN, a p-type high resistivity layer 46 formed of a Mg-doped GaAlN, and a p-type contact layer 18 formed of a Mg-doped GaN and exhibiting a low resistivity, said p-type contact layer 18 including as an intermediate layer a high resistivity type or an n-type current blocking layer 17. The laminate structure formed on the n-type contact layer 12 including the uppermost p-type contact layer 18 and a surface region of the n-type contact layer 12 is selectively removed by etching. An n-side electrode 21 is formed on the exposed surface of the n-type contact layer 12, and a p-side electrode 22 is formed on a surface of the remaining p-type contact layer 18.

The p-type high resistivity layer 46 is sandwiched between the laminate structure, which consists of the p-type low resistivity layer 16 and the p-type layer 45, and the p-type contact layer 18 so as to form a heat generation laminate structure. Also, the current blocking layer 17 has a striped opening 17a having a width of 3 µm so as to form a current path narrowing structure. The threshold value of the laser constructed as shown in FIG. 8 is 1 $kA/cm^2$, which is one-fifth or less of the value in the prior art.

Figure 9:
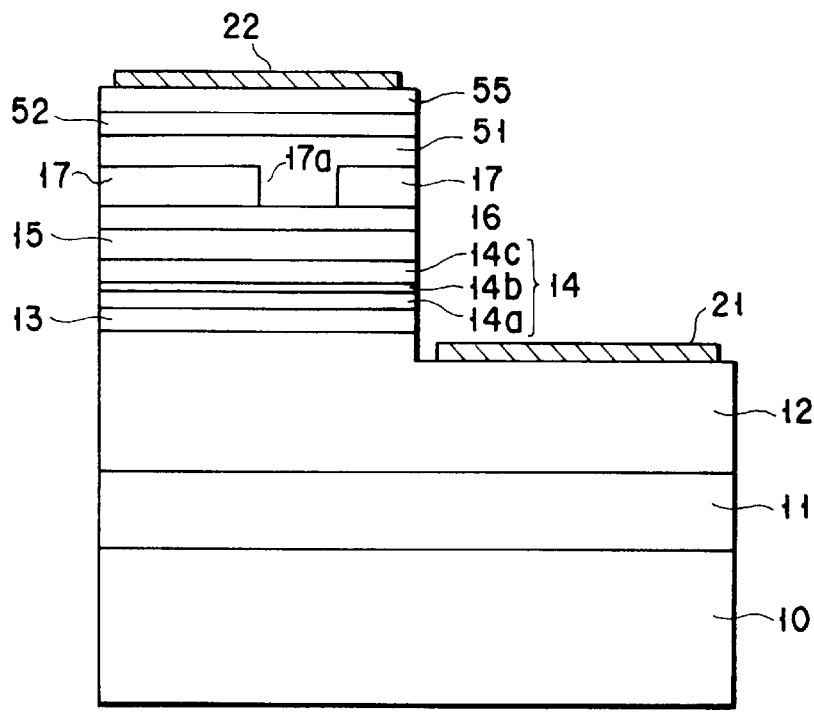
FIG. 9 shows a gallium nitride-based compound semiconductor laser according to another embodiment of the present invention.

The semiconductor laser of the embodiment shown in FIG. 9 is equal in construction to the semiconductor laser shown in FIG. 3 in the laminate structure including the lowermost layer of the sapphire substrate 10 and the uppermost layer of the p-type cladding layer 15. In the embodiment of FIG. 9, formed on the p-type cladding layer 15 is a laminate structure consisting of a p-type low resistivity layer 16 formed of a Mg-doped GaN, a high resistivity type or an n-type current blocking layer 17, a p-type layer 51 formed of a Mg-doped GaAlN, a p-type high resistivity layer 52 formed of a Mg-doped $In_{0.3}Ga_{0.7}N$, and p-type contact layer 55 formed of a Mg-doped $In_{0.2}Ga_{0.8}N$ and exhibiting a low resistivity. The laminate structure formed on the n-type contact layer 12 including the uppermost p-type contact layer 55 and a surface region of the n-type contact layer 12 is selectively removed by etching. An n-side electrode 21 is formed on the exposed surface of the n-type contact layer 12, and a p-side electrode 22 is formed on a surface of the remaining p-type contact layer 55.

The current blocking layer 17 has a striped opening 17a having a width of 3 µm so as to form a current path narrowing structure. Also, the p-type high resistivity layer 52 is sandwiched between the p-type layer 51 and the p-type contact layer 55 so as to form a heat generation laminate structure. The threshold value of the laser constructed as shown in FIG. 9 is 1 $kA/cm^2$, which is one-fifth or less of the value in the prior art.

In the gallium nitride-based compound semiconductor device in any of the embodiments shown in FIGS. 3 to 9, a p-type high resistivity layer is sandwiched between two adjacent p-type low resistivity layers so as to form a heat generation laminate structure, making it possible to provide a semiconductor device exhibiting a low threshold value which was not obtained in the conventional device.

Figure 10:
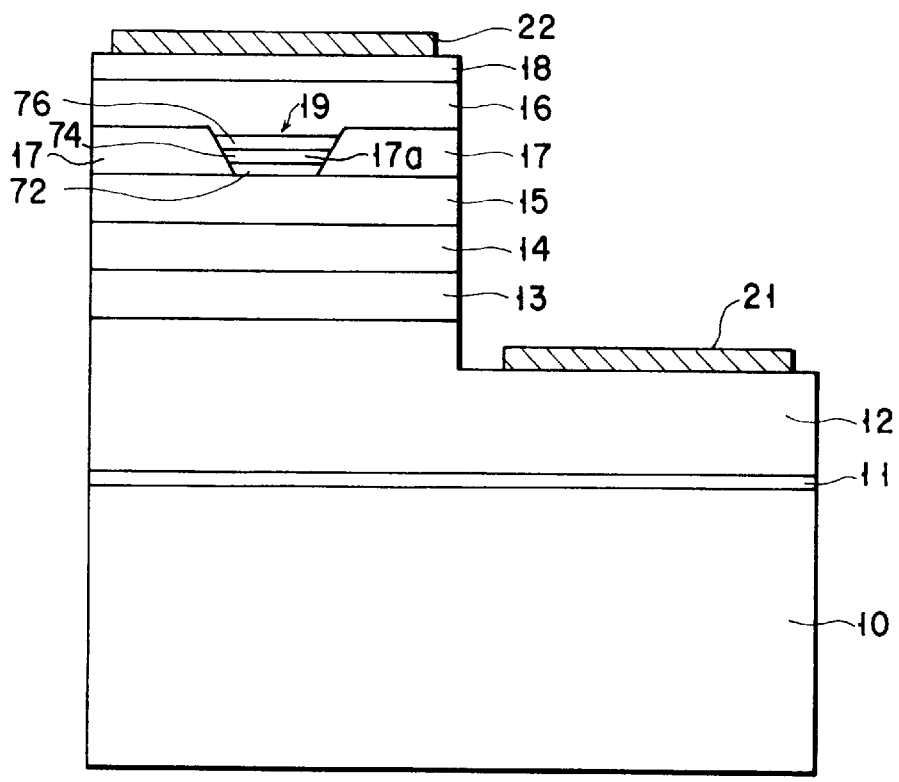
FIG. 10 shows a gallium nitride-based compound semiconductor laser according to another embodiment of the present invention.

FIG. 10 is a cross sectional view showing a gallium nitride-based compound semiconductor laser according to still another embodiment of the present invention. In this embodiment, a p-type buried layer consisting essentially of a gallium nitride-based compound semiconductor represented by a general formula $In_xGa_yAl_{1-x-y}N$ ($0 \leq x \leq 1$, $0y \leq 1$) is buried in an open portion (current path) of a current path narrowing structure of the semiconductor device. Also, a heat generation structure for increasing the substantial p-type carriers is formed in the buried layer noted above. In other words, this embodiment is featured in that the heat generation structure by means of the modulation doping, which was described previously in conjunction with the embodiments shown in FIGS. 1 and 2 or the heat generation structure utilizing a heat generation laminate structure, which was described in conjunction with the embodiments shown in FIGS. 3 to 9, is formed within a buried layer formed in an open portion of the current path narrowing structure of a semiconductor laser.

To be more specific, in the semiconductor laser of the embodiment shown in FIG. 10, a laminate structure consisting of a buffer layer 11 formed of an undoped GaN and an n-type contact layer 12 formed of a Si-doped GaN is formed on a single crystalline substrate, e.g., a sapphire substrate 10. Formed on the n-type contact layer 12 is a laminate structure consisting of an n-type cladding layer 13 formed of a Si-doped GaAlN, an active layer 14, and a p-type cladding layer 15 formed of a Mg-doped GaAlN so as to form a double hetero junction structure. The active layer 14 constitutes a multi-quantum well (MQW) structure consisting of a periodic structure in which two kinds of InGaAlN layers each having a thickness of 10 nm or less and differing from each other in the band gap energy are formed alternately and repeatedly.

A current blocking layer 17 consisting of an undoped GaN and exhibiting a high resistivity is formed on the p-type cladding layer 15. The current blocking layer 17 includes a striped open portion 17a having a width of 3 µm so as to form a current path narrowing structure. Buried in the open portion 17a is a heat generation laminate structure, i.e., a buried layer 19 of three layer structure, constructed such that a p-type high resistivity sub-layer 74 is sandwiched between two adjacent p-type low resistivity sub-layers 72 and 76. Each of these p-type low resistivity sub-layers 72 and 76 consists of a Mg-doped GaN exhibiting a low resistivity. On the other hand, the p-type high resistivity sub-layer 74 is formed of a Mg-doped GaAlN. As described previously, it is possible to form a heat generation structure within the buried layer 19 by means of, for example, modulation doping of Mg (as shown in FIG. 2A) in place of the heat generation laminate structure shown in the drawing.

Formed to cover the current blocking layer 17 and the buried layer 19 of three layer structure is a laminate structure consisting of a p-type low resistivity layer 16 formed of a Mg-doped GaN and a p-type contact layer 18 formed of a Mg-doped GaN and exhibiting a low resistivity. The laminate structure formed on the n-type contact layer 12 including the uppermost p-type contact layer 18 and a surface region of the n-type contact layer 12 is selectively removed by etching. An n-side electrode 21 is formed on the exposed surface of the n-type contact layer 12, and a p-side electrode 22 is formed on a surface of the remaining p-type contact layer 18.

The stripe width of the open portion 17a of the current blocking layer 17 constituting a current path narrowing structure can be set optionally by controlling the etching conditions. Where the stripe width is set to be as small as 3 $\mu$m or less, it is possible to make negligibly small the effect given to the active layer 14 by the heat generated from the heat generation structure in the buried layer 19. At the same time, heat can be effectively supplied to the buried layer 19 so as to activate the carriers. As a result, the temperature is locally elevated within the buried layer 19. However, the p-type carriers are increased in the regions other than the buried layer 19 so as to decrease the carrier overflow and, thus, to lower the threshold value of the laser oscillation, with the result that the temperature is lowered in spite of the local temperature elevation within the buried layer 19.

In the embodiment shown in FIG. 10, it is possible to use optional compositions of GaN, GaInN and GaAlN for forming the heat generation layer or heat generation region included in the heat generation structure. For example, it is possible to use GaInN for forming all the layers constituting the buried layer 19. In this case, the electrical conductivity of the constituting layers can be varied by changing the kind of the dopant or the doping amount. Where diffusion of the dopant may possibly pose a problem in actually operating the laser, it is desirable to use GaAlN for forming one or all of the layers constituting the buried layer 19. In this case, even if the dopant is diffused, the acceptor level of the dopant within the GaAlN layer is relatively deep, compared with the acceptor level of the same dopant within the GaN or GaInN layer, making it possible to vary the carrier density so as to vary the electrical conductivity.

In the embodiment shown in FIG. 10, the high resistivity sub-layer 74 within the buried layer 19 is sandwiched between the low resistivity sub-layers 72 and 76. However, it is also possible to have the high resistivity sub-layer 74 to be positioned to constitute the lowermost or uppermost sub-layer of the buried layer 19 of the three layer structure. For example, it is possible to bury a Mg-doped GaAlN layer exhibiting a high resistivity within the open portion 17a of the current blocking layer 17 in direct contact with the p-type GaAlN cladding layer 15. Further, it is also possible to bury a single layer having a resistivity higher than that of the p-type GaN layer in a manner to fill the entire region of the open portion 17a. Alternatively, it is possible to form the current blocking layer 17 within the p-type GaAlN cladding layer 15, not on the cladding layer 15. Further, the current blocking layer 17 can be formed in place of the cladding layer 15. Still further, it is possible to form a current path narrowing structure or a heat generation structure on the side of the n-side electrode.

In the gallium nitride-based compound semiconductor device of the embodiment shown in FIG. 10, a heat generation structure is formed within a p-type buried layer positioned in an open portion of a current path narrowing structure, making it possible to obtain a semiconductor device having a low threshold value which was not obtained in the conventional device.

Further, in the present invention, the heat generation structure can be formed of GaN/AlGaN MQW (super lattice layer). In this case, it suffices for the heat generation structure to include at least a single pair of GaN/AlGaN layers. Also, the pair of GaN/AlGaN layers may be repeated to form a multi-layer structure. Further, the doping may be modulated or may be uniform. In the heat generation structure of this type, heat generation is caused by the difference in composition such as GaN/AlGaN layers.

Figure 11:
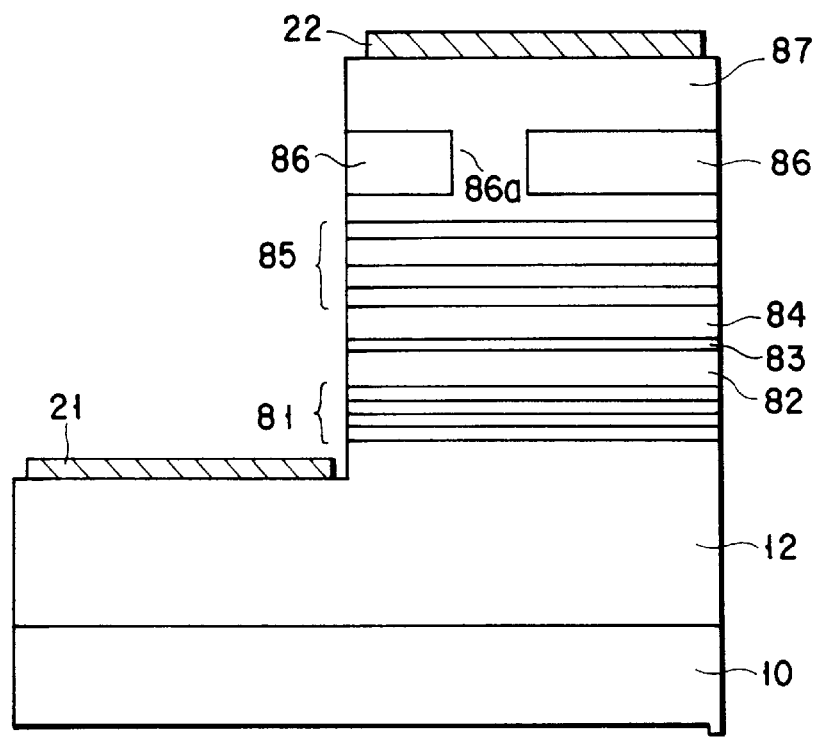
FIG. 11 shows a gallium nitride-based compound semiconductor laser according to another embodiment of the present invention.
Figure 12:
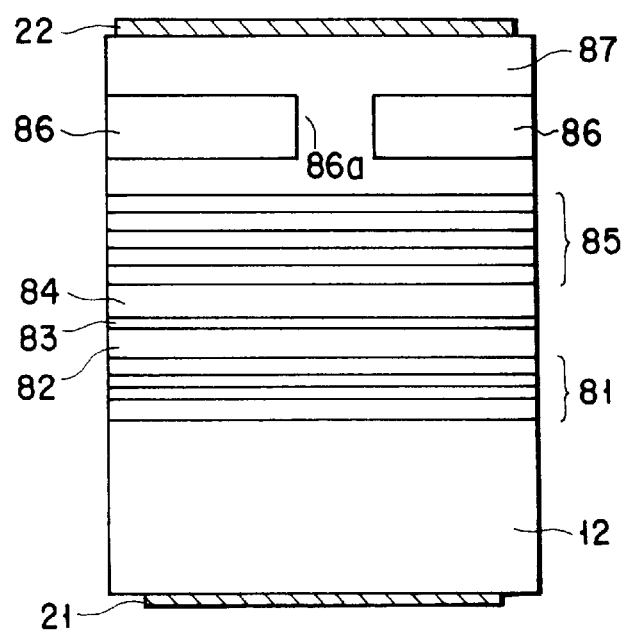
FIG. 12 shows a gallium nitride-based compound semiconductor laser according to still another embodiment of the present invention.

FIGS. 11 and 12 exemplify the particular heat generation structure described above. Specifically, in a semiconductor laser of the embodiment shown in FIG. 11, a Si-doped n-type GaN contact layer 12 is formed on a single crystalline substrate such as a sapphire substrate 10. Formed on the n-type contact layer 12 is a laminate structure consisting of an n-type (GaN/AlGaN)MQW cladding layer 81, a n-type GaN guide layer 82, an InGaN/InGaN MQW active layer 83, a p-type GaN guide layer 84 and a p-type (GaN/AlGaN) MQW heat generating cladding layer 85 in the order mentioned.

A p-type GaN contact layer 87 including an AlGaN current blocking layer 86 is formed on the p-type (GaN/ AlGaN) MQW heat generating cladding layer 85. Further, the laminate structure formed on the n-type contact layer 12 including the uppermost p-type contact layer 87 and a surface region of the n-type contact layer 12 is selectively removed by etching. An n-side electrode 21 is formed on the exposed surface of the n-type contact layer 12, and a p-side electrode 22 is formed on a surface of the remaining p-type contact layer 87.

The current blocking layer 86 includes a striped open portion 86a having a width of 1 $\mu$m so as to form a current path narrowing structure. The laser of the particular structure was found to exhibit a rising voltage of 3 V in contrast to 7 V for the conventional device.

A semiconductor laser shown in FIG. 12 is substantially equal in construction to the semiconductor laser shown in FIG. 11, except that, in the embodiment of FIG. 12, the n-type GaN contact layer 12 is used as a substrate, and that the n-side electrode is formed on a back surface of the contact layer 12. In the semiconductor laser shown in FIG. 12, the rising voltage was found to be 3 V in contrast to 7 V for the conventional device.

In order to form a heat generation layer or a heat generating region within a heat generation structure in each of the embodiments shown in FIGS. 1 to 12, it is possible to use Zn, P or O as a dopant in place of Mg so as to form a deep level. It is also possible to decrease the carrier concentration without using a dopant. Further, it is possible to use a small amount of Si, Sn, Se, Te, Ge, S, etc. as a dopant so as to form an n-type thin region or layer.

Also, the composition of each of the layers of the laminate structure is specifically defined in each of the embodiments shown in FIGS. 1 to 12. However, the composition can be changed in various fashions as far as the composition meets the general formula $In_xGa_yAl_{1-x-y}N$ ($0 \leq x \leq 1$, $0 \leq y \leq 1$). Further, each of the embodiments described above is directed to a semiconductor laser of a double hetero structure in which an active layer is sandwiched between cladding layers. However, the present invention is not limited to the particular embodiments. For example, the technical idea of the present invention can be applied to a semiconductor laser of an SCH (Separate Confining Hetero-structure) structure in which an active layer is sandwiched between guide layers formed of GaN or InGaN, and cladding layers are further formed to cover the outer surfaces of these guide layers.

Further, each of the embodiments described above is directed to a semiconductor laser including a current path narrowing structure of an IS (Inner Stripe) type. However, the technical idea of the present invention can also be applied to a semiconductor laser including a current path narrowing structure of a BH (Buried Hetero-structure) type or a BSR (Selectively Buried Ridge Wave Guide) type. Still further, the present invention is not limited to a semiconductor laser. In other words, the technical idea of the present invention can also be applied to another semiconductor device using a gallium nitride-based compound semiconductor material of the composition represented by a general formula $In_xGa_yAl_{1-x-y}N$ ($0 \leq x \leq 1$, $0 \leq y \leq 1$) and to a plurality of semiconductor devices integrated on a single substrate.

As described above, the present invention provides a gallium nitride-based compound semiconductor device, in which a heat generation structure is formed between a p-side electrode and a pn junction so as to permit the semiconductor device to exhibit a low threshold value, to be operable at low voltage, to exhibit a high reliability, and to be adapted for application in, for example, an optical disk. Further, the particular construction of the present invention makes it possible to provide a gallium nitride-based compound semiconductor device of a short wavelength bistable type or a self-oscillation type.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A gallium nitride-based compound semiconductor device, comprising:
   a laminate film consisting of a plurality of layers stacked one upon the other to form a pn-junction and formed of InGaAlN:
      an n-side electrode and a p-side electrode to supply current to said pn-junction; and
      a heat generation structure formed within said laminate film and comprising a low resistivity portion having a relatively low resistivity and a high resistivity portion having a relatively high resistivity and positioned adjacent to said low resistivity portion;
      wherein said low resistivity portion and said high resistivity portion are formed within a single layer, differ from each other in carrier concentration, and formed by introducing an impurity into said single layer in a different dose such that the low resistivity portion is positioned closer to said p-side electrode than the high resistivity portion.

2. The gallium nitride-based compound semiconductor device according to claim 1, wherein said InGaAlN is a material represented by following formula.

$$In_xGa_yAl_zN(x+y+z=1, 0 \leq =x+y+z \leq 1).$$

3. The gallium nitride-based compound semiconductor device according to claim 1, wherein said impurity is selected from the group consisting of Mg, Zn, P and O.

4. The gallium nitride-based compound semiconductor device according to claim 1, wherein said impurity is selected from the group consisting of Si, Sn, Se, Te, Ge and S.

5. The gallium nitride-based compound semiconductor device according to claim 1, wherein said laminate film includes a current blocking layer having an open portion arranged to form a current path narrowing structure, and said heat generation structure is positioned within said open portion of the current blocking layer.

6. A gallium nitride-based compound semiconductor device, comprising:
   a laminate film consisting of a plurality of layers stacked one upon the other to form a pn-junction and formed of InGaAlN:
      an n-side electrode and a p-side electrode to supply current to said pn-junction; and
      a heat generation structure formed within said laminate film and comprising a low resistivity portion having a relatively low resistivity and a high resistivity portion having a relatively high resistivity and positioned adjacent to said low resistivity portion;
      wherein said low resistivity portion and said high resistivity portion differ from each other in electrical conductivity, and consist of two layers stacked one upon the other such that said layer constituting the low resistivity portion is positioned closer to said p-side electrode than the other layer constituting the high resistivity portion.

7. The gallium nitride-based compound semiconductor device according to claim 6, wherein said InGaAlN is a material represented by following formula.

$$In_xGa_yAl_zN(x+y+z=1, 0 \leq x+y+z \leq 1).$$

8. The gallium nitride-based compound semiconductor device according to claim 6, wherein said high resistivity portion differs from said low resistivity portion in the Ga content.

9. The gallium nitride-based compound semiconductor device according to claim 6, wherein said high resistivity portion differs from said low resistivity portion in the Al content.

10. The gallium nitride-based compound semiconductor device according to claim 6, wherein said high resistivity portion differs from said low resistivity portion in the In content.

11. The gallium nitride-based compound semiconductor device according to claim 6, wherein said laminate film includes a current blocking layer having an open portion arranged to form a current path narrowing structure, and said heat generation structure is positioned within said open portion of the current blocking layer.

12. A gallium nitride-based compound semiconductor device, comprising:
   a laminate film consisting of a plurality of layers stacked one upon the other to form a pn-junction and formed of InGaAlN:
      an n-side electrode and a p-side electrode to supply current to said pn-junction; and
      a heat generation structure formed within said laminate film and comprising a low resistivity portion having a relatively low resistivity and a high resistivity portion having a relatively high resistivity and positioned adjacent to said low resistivity portion;

wherein said low resistivity portion is positioned closer to said p-side electrode than said high resistivity portion.

13. The gallium nitride-based compound semiconductor device according to claim 12, wherein said InGaAlN is a material represented by following formula.

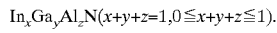

$In_xGa_yAl_zN(x+y+z=1, 0 \leq x+y+z \leq 1)$.

14. The gallium nitride-based compound semiconductor device according to claim 12, wherein said low resistivity portion and said high resistivity portion include two regions differing from each other in the carrier concentration and formed by introducing an impurity into a single layer in a different dose.

15. The gallium nitride-based compound semiconductor device according to claim 14, wherein said impurity is selected from the group consisting of Mg, Zn, P and O.

16. The gallium nitride-based compound semiconductor device according to claim 14, wherein said impurity is selected from the group consisting of Si, Sn, Se, Te, Ge and S.

17. The gallium nitride-based compound semiconductor device according to claim 12, wherein said low resistivity portion and said high resistivity portion differ from each other in electrical conductivity and include two layers laminated one upon the other.

18. The gallium nitride-based compound semiconductor device according to claim 17, wherein said low resistivity portion and said high resistivity portion differ from each other in Ga content.

19. The gallium nitride-based compound semiconductor device according to claim 17, wherein said low resistivity portion and said high resistivity portion differ from each other in Al content.

20. The gallium nitride-based compound semiconductor device according to claim 17, wherein said low resistivity portion and said high resistivity portion differ from each other in In content.

21. The gallium nitride-based compound semiconductor device according to claim 12, wherein said laminate film includes a current blocking layer having an open portion arranged to form a current path narrowing structure, and said heat generation structure is positioned within said open portion of the current blocking layer.

22. The gallium nitride-based compound semiconductor device according to claim 12, wherein said semiconductor device is a semiconductor laser.

* * * * *